US011735936B2

(12) United States Patent
Moon et al.

(10) Patent No.: US 11,735,936 B2
(45) Date of Patent: Aug. 22, 2023

(54) WIRELESS CHARGING DEVICE

(71) Applicant: SAMSUNG ELECTRONICS CO., LTD., Suwon-si (KR)

(72) Inventors: Hongki Moon, Seoul (KR); Kihyun Kim, Suwon-si (KR); Jae-Il Seo, Suwon-si (KR); Jihong Kim, Suwon-si (KR); Yoon-Sun Park, Yongin-si (KR); Wooram Lee, Hwaseong-si (KR); Se-Young Jang, Seongnam-si (KR); Jongchul Hong, Seongnam-si (KR); Kyungha Koo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/055,271

(22) Filed: Nov. 14, 2022

(65) Prior Publication Data
US 2023/0075973 A1  Mar. 9, 2023

Related U.S. Application Data

(63) Continuation of application No. 16/324,527, filed as application No. PCT/KR2017/007931 on Jul. 24, 2017, now Pat. No. 11,503,745.

(30) Foreign Application Priority Data

Aug. 10, 2016 (KR) .................. 10-2016-0101754

(51) Int. Cl.
*H02J 7/00* (2006.01)
*H02J 50/70* (2016.01)
(Continued)

(52) U.S. Cl.
CPC .......... *H02J 7/0042* (2013.01); *H02J 7/0044* (2013.01); *H02J 7/02* (2013.01); *H02J 50/10* (2016.02);
(Continued)

(58) Field of Classification Search
CPC .... H02J 7/0042; H02J 50/10; H05K 7/20172; H05K 7/20909
(Continued)

(56) References Cited

U.S. PATENT DOCUMENTS 9,979,241 B2 *  5/2018  Park .................. H02J 50/80
2010/0253281 A1 * 10/2010  Li .................... H02J 50/80
                                                                    320/108
(Continued)

FOREIGN PATENT DOCUMENTS

KR  10-2006-0036017 A  4/2006
KR  20-2010-0005566 U  5/2010
(Continued)

OTHER PUBLICATIONS

International Search Report dated Nov. 2, 2017 in connection with International Patent Application No. PCT/KR2017/007931, 2 pages.
(Continued)

*Primary Examiner* — Alfonso Perez Borroto

(57) ABSTRACT

According to various embodiments, a wireless charging device can comprise: a first housing, which includes a first surface facing a first direction and a second surface facing a second direction opposite to the first direction, and includes at least one hole; a second housing arranged on the second surface of the first housing in the second direction; a coil unit arranged between the first housing and the second housing and configured to transmit power to an external device; a shielding member arranged adjacent to the coil unit and including at least one hole; and a fan arranged adjacent to the coil unit and configured to rotate.

15 Claims, 18 Drawing Sheets

(51) Int. Cl.
    *H02J 50/10* (2016.01)
    *H02J 7/02* (2016.01)
    *H05K 7/20* (2006.01)
    *H05K 5/00* (2006.01)

(52) U.S. Cl.
    CPC ............ *H02J 50/70* (2016.02); *H05K 5/0004* (2013.01); *H05K 7/20* (2013.01); *H05K 7/20172* (2013.01); *H05K 7/20909* (2013.01)

(58) Field of Classification Search
    USPC .......................................................... 320/108
    See application file for complete search history.

(56) References Cited

U.S. PATENT DOCUMENTS

| | | | |
|---|---|---|---|
| 2011/0018679 A1* | 1/2011 | Davis ...................... | H02J 50/10 320/155 |
| 2015/0007190 A1 | 1/2015 | Diefenbaugh et al. | |
| 2016/0181849 A1 | 6/2016 | Govindaraj | |
| 2016/0190850 A1 | 6/2016 | Jeganathan et al. | |
| 2017/0047769 A1 | 2/2017 | Kim et al. | |

FOREIGN PATENT DOCUMENTS

| | | |
|---|---|---|
| KR | 10-2014-0072294 A | 6/2014 |
| KR | 10-2014-0100381 A | 8/2014 |
| KR | 10-2015-0021318 A | 3/2015 |
| KR | 20-2016-0000997 U | 3/2016 |
| WO | 2010/026805 A1 | 3/2010 |
| WO | 2014/148853 A1 | 9/2014 |

OTHER PUBLICATIONS

Written Opinion of the International Searching Authority dated Nov. 2, 2017 in connection with International Patent Application No. PCT/KR2017/007931, 2 pages.

European Search Report dated Feb. 12, 2021 in connection with European Patent Application No. 20185526, 6 pages.

European Patent Office, "Supplementary European Search Report," Application No. EP17839688.3, dated Mar. 26, 2019, 7 pages.

Korean Intellectual Property Office, "Office Action," dated Mar. 15, 2023, in connection with Korean Patent Application No. KR10-2016-0101754, 13 pages.

\* cited by examiner

WIRELESS CHARGING DEVICE

CROSS-REFERENCE TO RELATED APPLICATIONS

This application is a continuation of application Ser. No. 16/324,527, now U.S. Pat. No. 11,503,745 issued Nov. 15, 2022, which is a 371 of International Application No. PCT/KR2017/007931 filed on Jul. 24, 2017, which claims priority to Korean Patent Application No. 10-2016-0101754 filed on Aug. 10, 2016, the disclosures of which are herein incorporated by reference in their entirety.

BACKGROUND

1. Field

Various exemplary embodiments of the present disclosure relate to a wireless charging device.

2. Description of Related Art

A wireless charging device can convert electric energy in an electromagnetic wave form, to wirelessly forward power to an external device without a transmission line. A wireless charging scheme can be various such as a magnetic induction scheme, a self resonance scheme or the like.

At wireless charging, a heat can be generated due to efficiency deterioration, because arrangement alignment is not made between internal parts of the wireless charging device. The heat generated in the wireless charging device can be cooled in an air forced convection scheme using a fan.

In a cooling of a forced convection scheme using a fan of a wireless charging device, there can be limits in a cooling efficiency, because a channel of air introduced into the wireless charging device is restrictive. In response to the cooling of the wireless charging device not being made smoothly, it can bring about limitation in a usability.

Various embodiments of the present disclosure may provide a wireless charging device capable of decreasing heat generation that occurs at wireless charging. Also, various embodiments of the present disclosure may provide a wireless charging device capable of improving the cooling efficiency.

SUMMARY

According to various embodiments, a wireless charging device may include a first housing, which includes a first surface facing a first direction and a second surface facing a second direction opposite to the first direction, and includes at least one hole; a second housing arranged on the second surface of the first housing in the second direction; a coil unit arranged between the first housing and the second housing, and configured to transmit power to an external device; a shielding member arranged adjacent to the coil unit, and including at least one hole; and a fan arranged adjacent to the coil unit and configured to rotate.

Various embodiments of the present disclosure may provide a wireless charging device capable of decreasing heat generation that occurs at wireless charging. Also, various embodiments of the present disclosure may provide a wireless charging device capable of securing air channels in various directions, to improve a cooling efficiency.

DETAILED DESCRIPTION

Figure 1A:
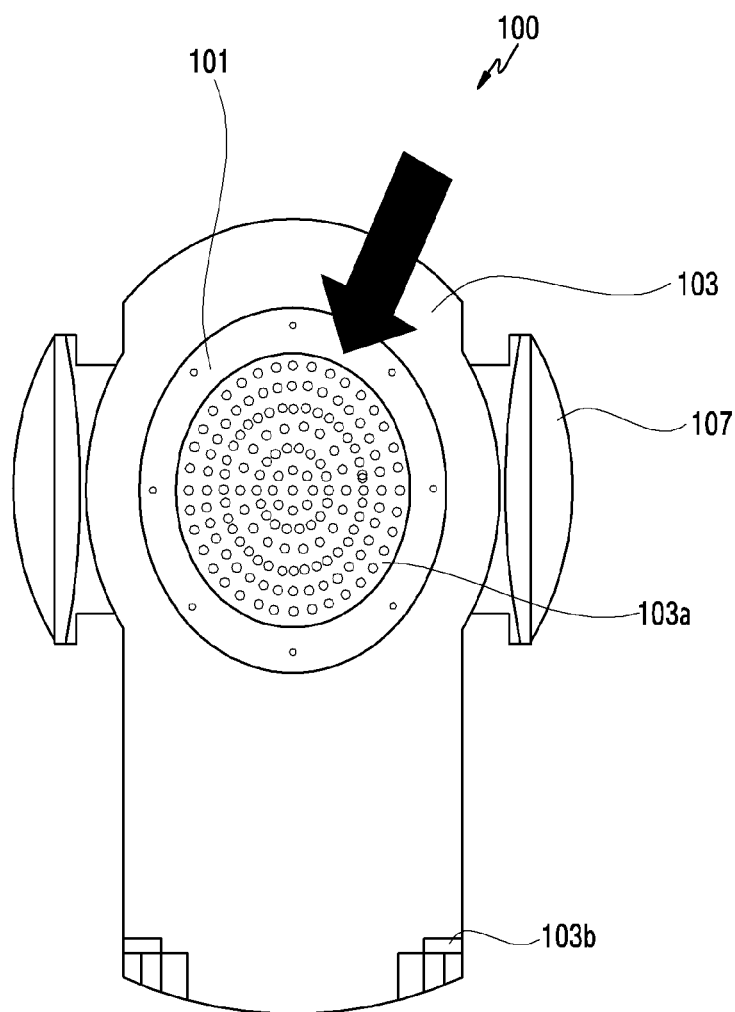
FIG. 1A illustrates a perspective view of a wireless charging device of various embodiments of the present disclosure.

Various embodiments of the present disclosure are mentioned below with reference to the accompanying drawings. However, these do not intend to limit the present disclosure to a specific embodiment form, and it should be understood to include various modifications, equivalents and/or alternatives of various embodiments of the present disclosure. In relation to a description of the drawing, like reference symbols may be used for like components.

In the present document, the expressions "have", "may have", "comprise", "may comprise", etc. indicate the existence of a corresponding feature (e.g., a numeral value, a function, an operation, or a component such as a part, etc.), and do not exclude the existence of an additional feature.

In the present document, the expression "A or B", "at least one of A or/and B", "one or more of A or/and B" or the like may include all available combinations of items enumerated together. For example, "A or B", "at least one of A and B", or "at least one of A or B" may denote all of the cases of (1) including at least one A, (2) including at least one B, or (3) including all of at least one A and at least one B.

The expressions "a first", "a second", "the first" "the second" or the like used in various embodiments may use various components irrespective of order and/or importance, and does not limit the corresponding components. The expressions may be used to distinguish one component from another component. For example, a first user device and a second user device may represent mutually different user devices, regardless of order or importance. For example, a first component may be named a second component without departing from the scope of right of the present disclosure. Likely, even a second component may be named interchangeably with a first component.

When it is mentioned that any component (e.g., a first component) is "(operatively or communicatively) coupled with/to" another component (e.g., a second component) or is "connected to", it should be understood that the any component may be directly coupled to the another component, or be coupled through a further component (e.g., a third component). On the other hand, when it is mentioned that some component (e.g., a first component) is "directly coupled to" another component (e.g., a second component) or is "directly connected to", it may be understood that a further component (e.g., a third component) does not exist between the some component and the another component.

The expression "configured (or set) to~" used in the present document may be used interchangeably with, for example, "suitable for~", "having the capacity to~", "designed to~", "adapted to~", "made to~" or "capable of~" according to context. The term "configured (or set) to~" may not necessarily mean only "specifically designed to" in hardware. Instead, in some context, the expression "device configured to~" may mean that the device is "capable of ~" together with other devices or parts. For example, the phrase "processor configured (or set) to perform A, B, and C" may mean an exclusive processor (e.g., embedded processor) for performing a corresponding operation, or a generic-purpose processor (e.g., a CPU or an application processor) capable of performing corresponding operations by executing one or more software programs stored in a memory device.

The terms used in the present document are used to just explain a specific embodiment, and may not intend to limit the scope of another embodiment. The expression of a singular form may include the expression of a plural form unless otherwise dictating clearly in context. All the terms used herein including the technological or scientific terms may have the same meanings as those generally understood by a person having ordinary skill in the art of the present disclosure. The terms defined in a generally used dictionary may be construed as having the same or similar meanings as the contextual meanings of a related technology, and are not construed as having ideal or excessively formal meanings unless defined clearly in the present document. According to cases, even the term defined in the present document may not be construed as excluding embodiments of the present document.

Various embodiments of the present disclosure are explained below in more detail with reference to the drawings.

Figure 1B:
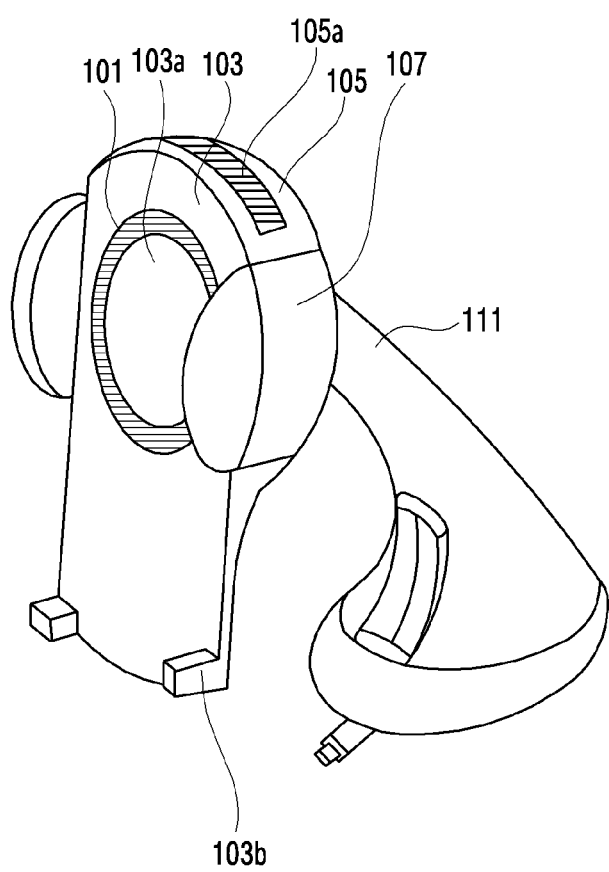
FIG. 1B illustrates a perspective view of a wireless charging device of various embodiments of the present disclosure.
Figure 1C:
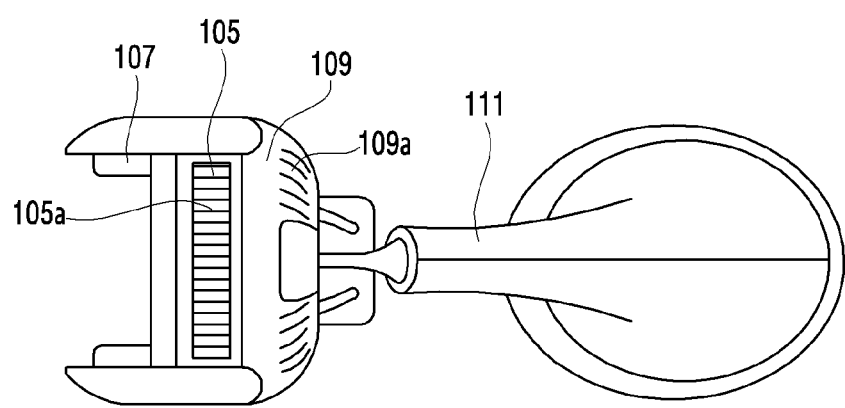
FIG. 1C illustrates a perspective view of a wireless charging device of various embodiments of the present disclosure.

FIG. 1A illustrates a perspective view of a wireless charging device of various embodiments of the present disclosure. FIG. 1B illustrates a perspective view of the wireless charging device of various embodiments of the present disclosure. FIG. 1C illustrates a perspective view of the wireless charging device of various embodiments of the present disclosure.

According to various embodiments, as illustrated in FIG. 1A, FIG. 1B and FIG. 1C, the wireless charging device 100 may include a first housing 103, a pad 101, a second housing 109, a third housing 105, a guide 107 and a support unit 111. The first housing 103, the pad 101, the second housing 109, the third housing 105, the guide 107 and the support unit 111 may form an appearance of the wireless charging device 100. The wireless charging device 100 may perform wireless charging for an external device needing charging. In an arrow direction illustrated in FIG. 1A, the external device needing the charging may be safely mounted in the wireless charging device 100.

According to various embodiments, the first housing 103 may protect parts of the wireless charging device 100. The first housing 103 may form a front surface of the wireless charging device 100. The first housing 103 may be a support body (support structure) of injection materials which forms an appearance design of the wireless charging device 100. A surface of the first housing 103 may include a plurality of holes 103a. Through the holes 103a, an air channel may be formed in a direction of the wireless charging device 100. This will be described later in detail.

According to various embodiments, the first housing 103 may be configured to safely mount an external device for receiving power applied. For example, the first housing 103 may include a safe mounting unit 103b that is configured to safely mount the external device. The safe mounting unit 103b may be a construction of having a given area and protruding in a direction of the first housing 103. The wireless charging device 100 may safely mount the external device in the safe mounting unit 103b, thereby performing wireless charging for the external device.

According to various embodiments, the pad 101 may be mounted in the first housing 103. For example, the first housing 103 may include a groove, and the pad 101 may be mounted in this groove. The pad 101 may be arranged such that an outer surface of the pad 101 is exposed at an upper surface of the first housing 103. The pad 101 may be configured to generate a frictional force with the external device placed in the first housing 103. For example, the pad 101 may include rubber materials, thereby generating a frictional force with the external device, to prevent the movement of the external device. The pad 101 may be configured, for example, in a ring shape.

According to various embodiments, the second housing 109 may protect parts of the wireless charging device 100. The second housing 109 may form a rear surface of the wireless charging device 100. The second housing 109 may be a support body (support structure) of injection materials that forms an appearance design of the wireless charging device 100. A surface of the second housing 109 may include a plurality of holes 109a. Through the holes 109a, an air channel may be formed in a direction of the wireless charging device 100.

According to various embodiments, the third housing 105 may be arranged between the first housing 103 and the second housing 109. The third housing 105 may protect parts of the wireless charging device 100. The third housing 105 may form a side surface of the wireless charging device 100. The third housing 105 may be a support body (support structure) of injection materials that forms an appearance design of the wireless charging device 100. A surface of the third housing 105 may include a plurality of holes 105a.

Through the holes 105a, an air channel may be formed in a direction of the wireless charging device 100.

According to various embodiments, the guide 107 may be configured to be movable at a side surface of the wireless charging device 100. The guide 107 may move in a horizontal direction to fit the size of the external device. The guide 107 may get distant from the first housing 103 or get close. The guide 107 may fix the external device that is safely mounted in the first housing 103. The guide 107 may apply a pressure to the external device, to prevent the movement of the external device.

According to various embodiments, the support unit 111 may form a rear surface of the wireless charging device 100. The support unit 111 may get in contact with an installation surface that is to install the wireless charging device 100. The support unit 111 may include injection materials, metals or the like that form an appearance design of the wireless charging device 100. A surface of the support unit 111 may be flat to be fixed to the installation surface. In response to the wireless charging device 100 being installed in a vehicle, wireless charging may be smoothly performed for the external device through the support unit 111 in spite of the occurrence of vibration or shaking during vehicle running.

Figure 1D:
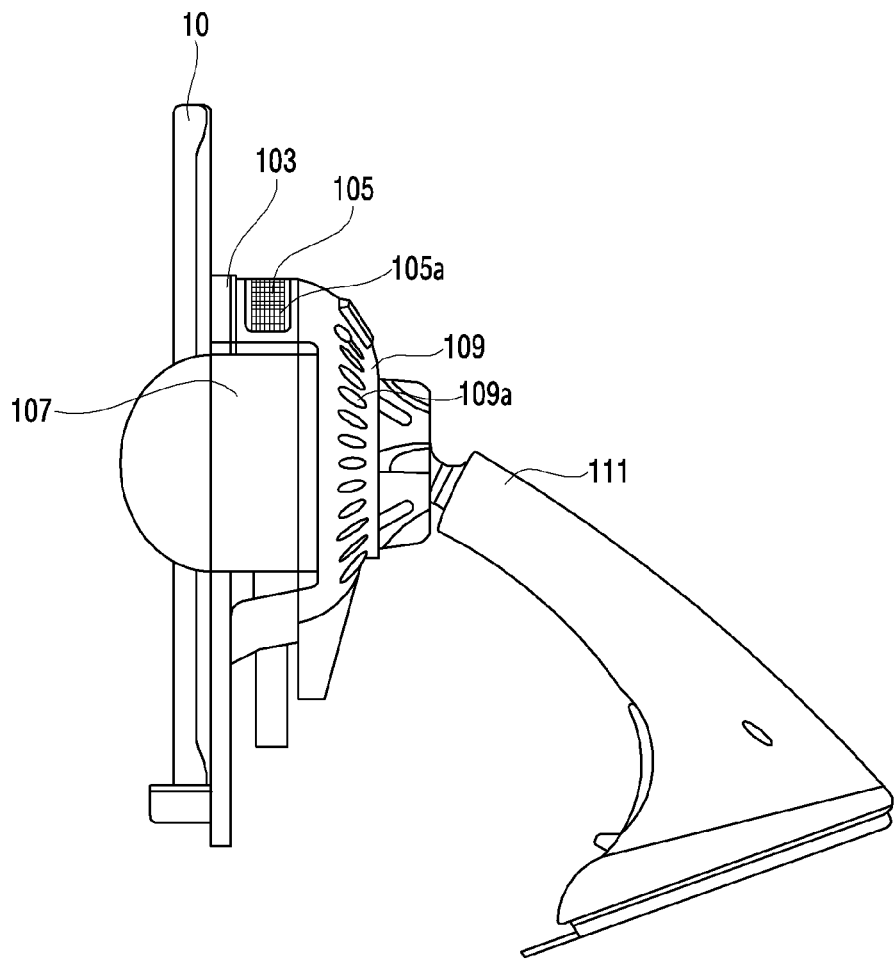
FIG. 1D illustrates an example view showing a state in which an external device is mounted in a wireless charging device of various embodiments of the present disclosure.
Figure 1E:
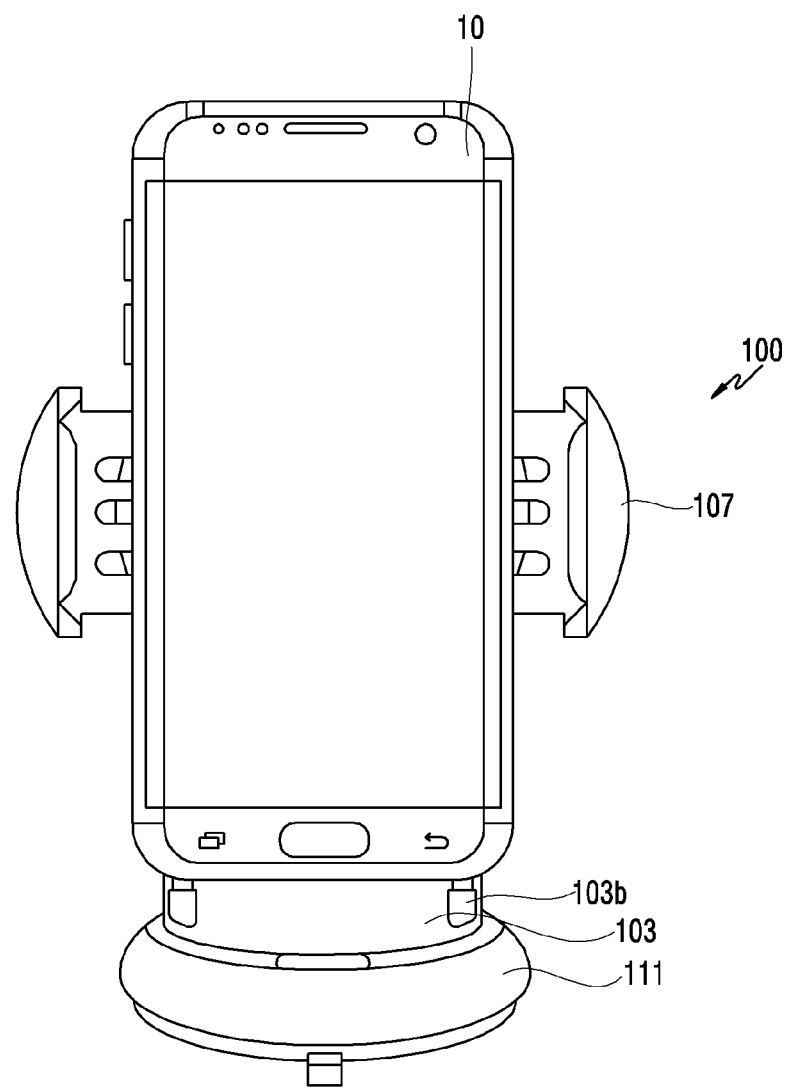
FIG. 1E illustrates an example view showing a state in which an external device is mounted in a wireless charging device of various embodiments of the present disclosure.
Figure 1F:
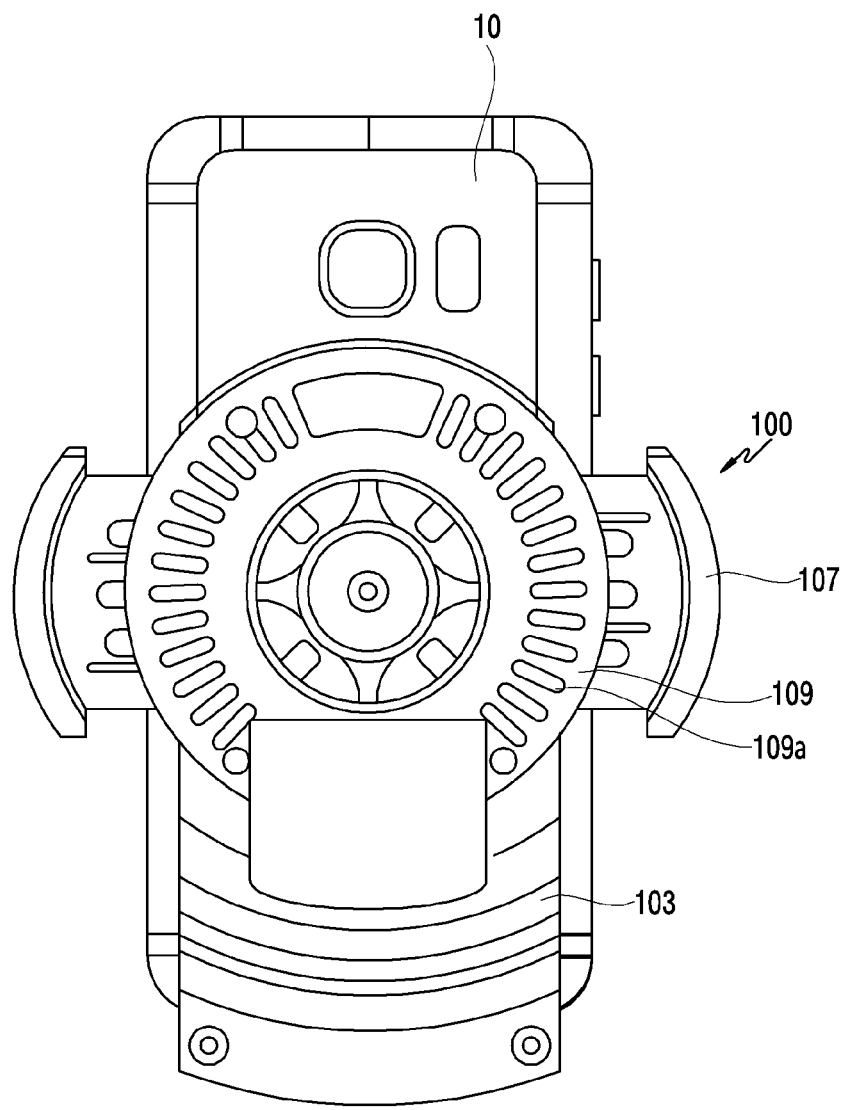
FIG. 1F illustrates an example view showing a state in which an external device is mounted in a wireless charging device of various embodiments of the present disclosure.
Figure 1G:
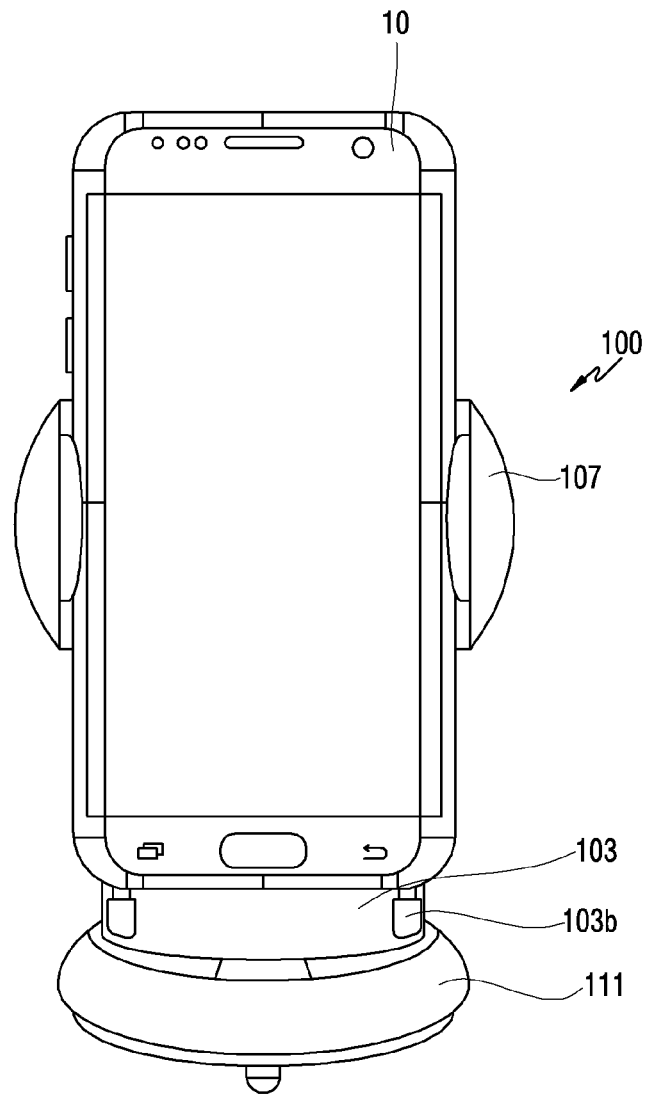
FIG. 1G illustrates an example view showing a state in which an external device is mounted in a wireless charging device of various embodiments of the present disclosure.
Figure 1H:
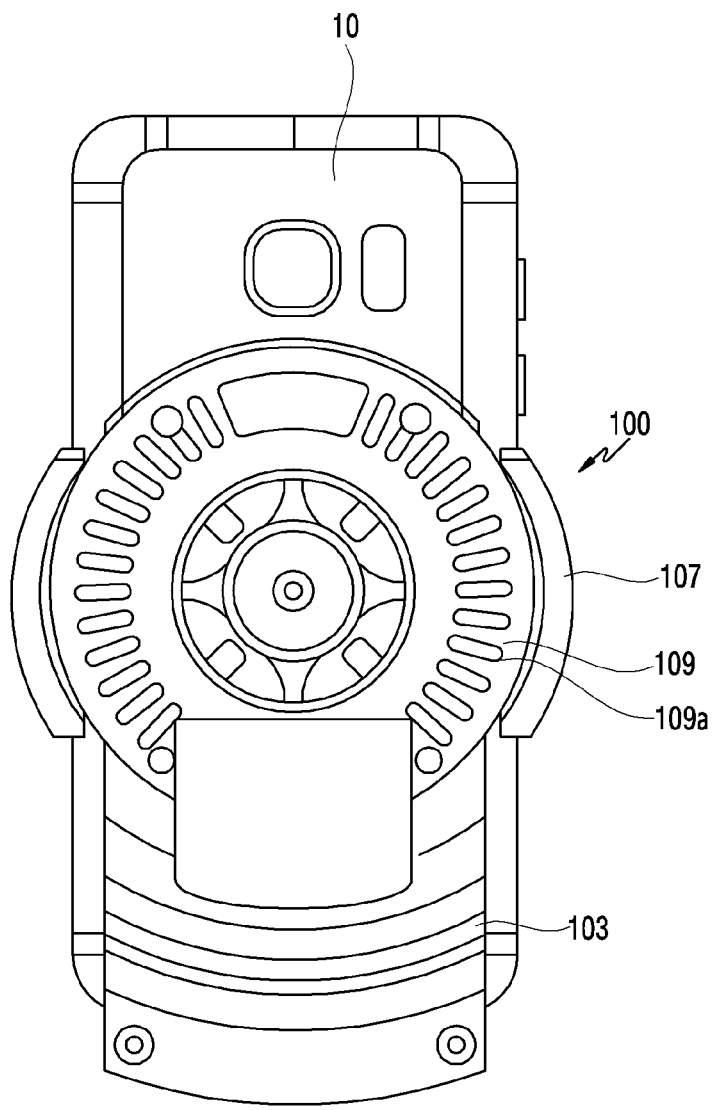
FIG. 1H illustrates an example view showing a state in which an external device is mounted in a wireless charging device of various embodiments of the present disclosure.

FIG. 1D illustrates an example view showing a state in which an external device is mounted in a wireless charging device of various embodiments of the present disclosure. FIG. 1E illustrates an example view showing the state in which the external device is mounted in the wireless charging device of various embodiments of the present disclosure. FIG. 1F illustrates an example view showing the state in which the external device is mounted in the wireless charging device of various embodiments of the present disclosure. FIG. 1G illustrates an example view showing a state in which the external device is mounted in the wireless charging device of various embodiments of the present disclosure. FIG. 1H illustrates an example view showing the state in which the external device is mounted in the wireless charging device of various embodiments of the present disclosure.

According to various embodiments, as illustrated in FIG. 1D, FIG. 1E, FIG. 1F, FIG. 1G and FIG. 1H, the external device 10 may be mounted in the wireless charging device 100. As explained earlier, the external device 10 may be safely mounted in the first housing 103 of the wireless charging device 100. For example, the external device 10 may be installed on the safe mounting unit 103b of the first housing 103.

In various embodiments, as illustrated in FIG. 1E and FIG. 1F, the guide 107 of the wireless charging device 100 may secure a space for installing the external device 10 through movement. The guide 107 may move in the horizontal direction, thereby forming the space such that the external device 10 may be safely mounted in the first housing 103. The guide 107 may move in the direction of getting distant from the first housing 103, to secure the space.

In various embodiments, as illustrated in FIG. 1G and FIG. 1H, the guide 107 may fix the external device 10 through movement. The guide 107 may move in the horizontal direction, thereby getting in contact with the external device 10. The guide 107 may move in the direction of getting close to the first housing 103, to apply a pressure to the external device 10. The guide 107 may prevent the movement of the external device 10 through a contact with the external device 10. In response to the wireless charging device 100 being installed in a vehicle, wireless charging may be smoothly performed for the external device 10 through the guide 107 in spite of the occurrence of vibration or shaking during vehicle running.

Figure 2A:
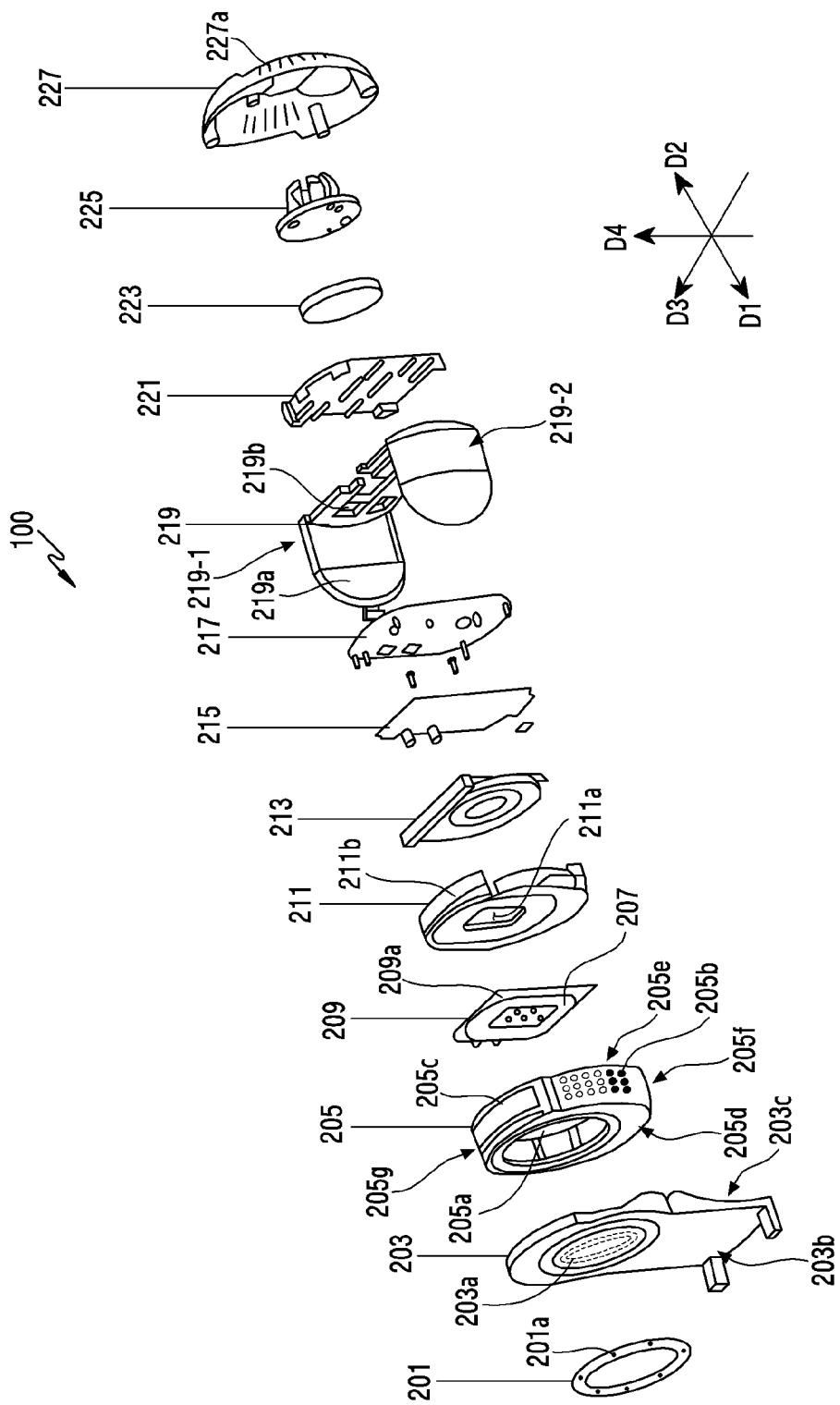
FIG. 2A and FIG. 2B illustrate exploded perspective views of a wireless charging device of various embodiments.
Figure 2B:
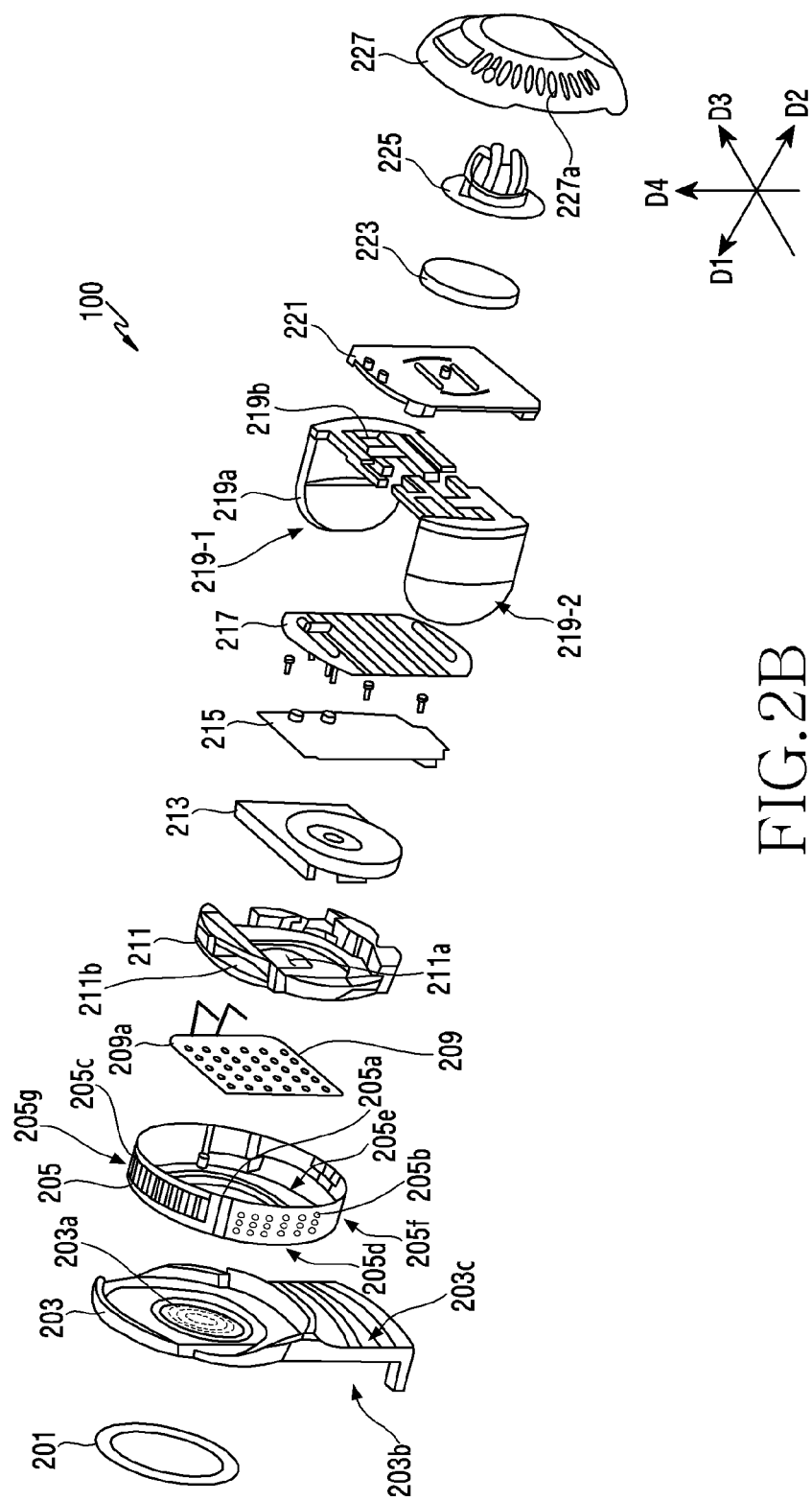

FIG. 2A and FIG. 2B illustrate exploded perspective views of a wireless charging device of various embodiments.

According to various embodiments, as illustrated in FIG. 2A and FIG. 2B, the wireless charging device 100 may include a pad 201, a first housing 203, a third housing 205, a coil unit 207, a shielding member 209, a bracket 211, a fan 213, a printed board assembly (PBA) 215, a first plate 217, a guide 219, a second plate 221, a gear 223, a mount 225, a second housing 227 and the like. Below, a detailed description of a construction being the same as or similar with the above-described construction may be omitted.

According to various embodiments, the pad 201 may include at least one protrusion 201a in a surface of the pad 201. The protrusion 201a may be configured to protrude from the surface of the pad 201. The protrusion 201a may be formed to protrude in a first direction (D1) of the drawing from the pad 201. In response to an external device (drawing symbol 10 of FIG. 1) being safely mounted in the first housing 203, the protrusion 201a may provide a space between the external device 101 and the first housing 203. The protrusion 201a may be such that the external device 10 may be installed at a given interval apart from the first housing 203. In various embodiments, by the protrusion 201a, the space may be provided between the external device 10 and the first housing 203 and, through this space, air may be introduced into the hole 203a of the first hosing 203. Through the protrusion 201a, air may be introduced in a second direction (D2) of the drawing in the wireless charging device 100. Through the protrusion 201a, an air channel may be formed in the second direction (D2).

The protrusion 201a may have a diameter of, for example, 0.1 mm to 0.4 mm. In response to the protrusion 201a being included in plural in the pad 201, the plurality of protrusions 201a may be arranged at a given interval apart. The protrusion 201a may be formed in various numbers and various shapes.

According to various embodiments, the first housing 203 may include a first surface 203b facing the first direction (D1), and a second surface 203c facing the second direction (D2) being opposite to the first direction (D1). The first housing 203 may include at least one hole 203a which passes through the first surface 203b and the second surface 203c. The hole 203a may form a passage through which external air may be introduced into the wireless charging device 100. The hole 203a may form an air channel in the second direction (D2). That is, the air introduced to a front surface of the wireless charging device 100 through the hole 203a may be forwarded to the fan 213.

According to various embodiments, the third housing 205 may be arranged on the second surface 203c of the first housing 203. The third housing 205 may be arranged on the second surface 203c of the first housing 203 in the second direction (D2). The third housing 205 may be arranged between the first housing 203 and the second housing 227.

According to various embodiments, the third housing 205 may include a first surface 205d facing the first direction (D1), and a second surface 205e facing the second direction (D2). The third housing 205 may include the hole 205a which passes through the first surface 205d and the second surface 205e. The hole 205a may be provided in the first direction (D1) or the second direction (D2). The hole 205a may form a passage through which external air may be introduced into the wireless charging device 100. The hole 205a may form a passage of air which is introduced from the hole 203a of the first housing 203. The hole 205a may form an air channel in the second direction (D2). That is, the air introduced to the front surface of the wireless charging device 100 through the hole 205a may be forwarded to the fan 213.

According to various embodiments, the third housing 205 may include a third surface 205f facing a third direction (D3) which intersects with the first direction (D1) and the second direction (D2). The third housing 205 may include a fourth surface 205g facing a fourth direction (D4) which intersects with the first direction (D1), the second direction (D2) and the third direction (D3).

According to various embodiments, the third housing 205 may include at least one hole 205b arranged in the third surface 205f. The hole 205b may be provided in the third direction (D3). The hole 205b may form a passage through which external air may be introduced into the wireless charging device 100. The hole 205b may form an air channel in the third direction (D3). That is, the air introduced to a side surface of the wireless charging device 100 through the hole 205b may be forwarded to the fan 213.

According to various embodiments, the third housing 205 may include at least one hole 205c arranged in the fourth surface 205g. The hole 205c may be provided in the fourth direction (D4). The hole 205c may form a passage through which air introduced into the wireless charging device 100 is discharged. For example, the air introduced through the air channel formed in the first direction (D1), the second direction (D2) or the third direction (D3) may be discharged out through the hole 205c. The air introduced into the wireless charging device 100 may be circulated through the fan 213 and then be discharged through the hole 205c together with a heat generated in the coil unit 207, the printed board assembly 215 or the like.

According to various embodiments, the coil unit 207 may be arranged between the first housing 203 and the second housing 227. The coil unit 207 may be configured to transmit power to the external device. The coil unit 207 may be a transmission coil. The coil unit 207 may forward power to a reception coil of the external device by using an electromagnetic induction phenomenon. The coil unit 207 may be a circular shape, a rectangular shape or a ring shape. The coil unit 207 may generate a heat at working.

According to various embodiments, the shielding member 209 may be arranged adjacent to the coil unit 207. The shielding member 209 may be arranged beneath the coil unit 207. The shielding member 209 may protect other electrical objects (for example, the fan 213, the printed board assembly 215 or the like) from an electromagnetic field which is generated in response to the coil unit 207 transmitting power, and enhance the efficiency of wireless power transmission. The shielding member 209 may be formed of, for example, a ferrite sheet.

According to various embodiments, the shielding member 209 may include a hole 209a. The hole 209a may form an air channel together with the hole 203a of the first housing 203, the hole 205a of the third housing or the hole 205b of the third housing. That is, the hole 209a may form the air channel in the second direction (D2). That is, air introduced to the front surface of the wireless charging device 100 through the hole 209a may be forwarded to the fan 213.

According to various embodiments, the bracket 211 may support the coil unit 207 and the shielding member 209. According to various embodiments, the bracket 211 may support the fan 213. The bracket 211 may be an internal injection structure capable of supporting various structures. The bracket 211 may include a hole 211a which is provided in the first direction (D1) or the second direction (D2). The bracket 211 may include a hole 211b which is provided in the fourth direction (D4). Through the holes 211a and 211b of the bracket 211, a flow of air through the fan 213 may be led. For example, through the hole 211a of the bracket 211, an air channel may be formed in the second direction (D2). That is, the air introduced to the front surface of the wireless charging device 100 through the hole 211a may be forwarded to the fan 213.

According to various embodiments, the hole 211b of the bracket 211 may form a passage through which air introduced into the wireless charging device 100 is discharged. For example, the hole 211b may discharge out the air introduced through the air channel formed in the first direction (D1), the second direction (D2) or the third direction (D3). The air introduced into the wireless charging device 100 may be circulated through the fan 213 and then be discharged out through the hole 211b together with a heat generated in the coil unit 207, the printed board assembly 215 or the like.

According to various embodiments, the fan 213 may be arranged between the coil unit 207 and the printed board assembly 215. The fan 213 may be configured to rotate. The fan 213 may make a flow of air between the coil unit 207 and the printed board assembly 215. The fan 213 may generate the circulation of air. For example, the fan 213 may be an airflow fan.

According to various embodiments, the fan 213 may be installed to face the coil unit 207 in an up/down laminate structure. The fan 213 may be mounted to face the printed board assembly 215 in an up/down laminate structure. The fan 213 may be arranged to be at a given interval with each of the shielding member 209 and the printed board assembly 215. Through this interval, an air movement path may be formed. Through this path, air including a heat generated by the coil unit 207 or the printed board assembly 215 may be discharged out by the fan 213.

According to various embodiments, the printed board assembly 215 may be arranged to face at a given interval with the fan 213. The printed board assembly 215 may include a power supply device and a wireless charging circuit. The power supply device of various embodiments may supply a power source to the wireless charging circuit. The wireless charging circuit of various embodiments may include at least some of an I/F, a control circuit, an I/F control, a DC-AC inverter. The I/F of various embodiments may be a connection path connected with the power supply device. The control circuit of various embodiments may control wireless charging. The I/F control of various embodiments may be a communication I/F for checking support or non-support of voltage change of the power supply device. The DC-AC inverter of various embodiments may switch and change DC power of the power supply device into AC power.

According to various embodiments, the first plate 217 may be arranged in the second direction (D2) from the printed board assembly 215. The first plate 217 may support the printed board assembly 215. The first plate 217 may be a support body (support structure) of injection materials.

According to various embodiments, the guide 219 may be arranged between the first housing 203 and the second housing 227. The guide 219 may include injection materials. The guide 219 may include a guide arm 219a which is extended in the first direction (D1). The guide arm 219a may fix the external device. The guide arm 219a may get in contact with the external device.

According to various embodiments, the guide 219 may be movable in the third direction (D3). For example, the guide 219 may include a first guide 219-1 and a second guide 219-2. The first guide 219-1 and the second guide 219-2 may be each configured to be movable in the third direction (D3). The first guide 219-1 and the second guide 219-2 may move to get close to each other. Or the first guide 219-1 and the second guide 219-2 may move to get distant from each other.

According to various embodiments, the guide 219 may include a hole 219b. The hole 219b may form an air channel in the first direction (D1). The hole 219b may form a passage through which external air may be introduced into the wireless charging device 100. The air introduced in the first direction (D1) through the hole 219b may be forwarded to the fan 213. That is, the air introduced to a rear surface of the wireless charging device 100 through the hole 219b may be forwarded to the fan 213.

According to various embodiments, the second plate 221 may be arranged in the second direction (D2) from the guide 219. The first plate 217 may support the guide 219. The first plate 217 may be a support body (support structure) of injection materials.

The gear 223 and the mount 225 may be arranged between the first housing 203 and the second housing 227. The gear 223 and the mount 225 may be combined with the support unit 111 explained earlier in FIG. 1. The gear 223 and the mount 225 may insert and fix the support unit 111.

The second housing 227 may be arranged on the second surface 203c of the first housing 203. The second housing 227 may be arranged on the second surface 203c of the first housing 203 in the second direction (D2). The second housing 227 may include at least one hole 227a. The hole 227a may form an air channel in the first direction (D1). The hole 227a may form a passage through which external air may be introduced into the wireless charging device 100. That is, through the hole 227a of the second housing 227, the external air may be introduced into the wireless charging device 100. The air introduced through the hole 227a in the first direction (D1) may be forwarded to the fan 213. That is, the air introduced to the rear surface of the wireless charging device 100 through the hole 227a may be forwarded to the fan 213. Also, the hole 227a may form a passage which discharges out the air introduced into the wireless charging device 100. The air introduced in various directions may be circulated through the fan 213, thereby being discharged out through the hole 227a together with a heat generated in the coil unit 207, the printed board assembly 215 or the like.

Figure 3A:
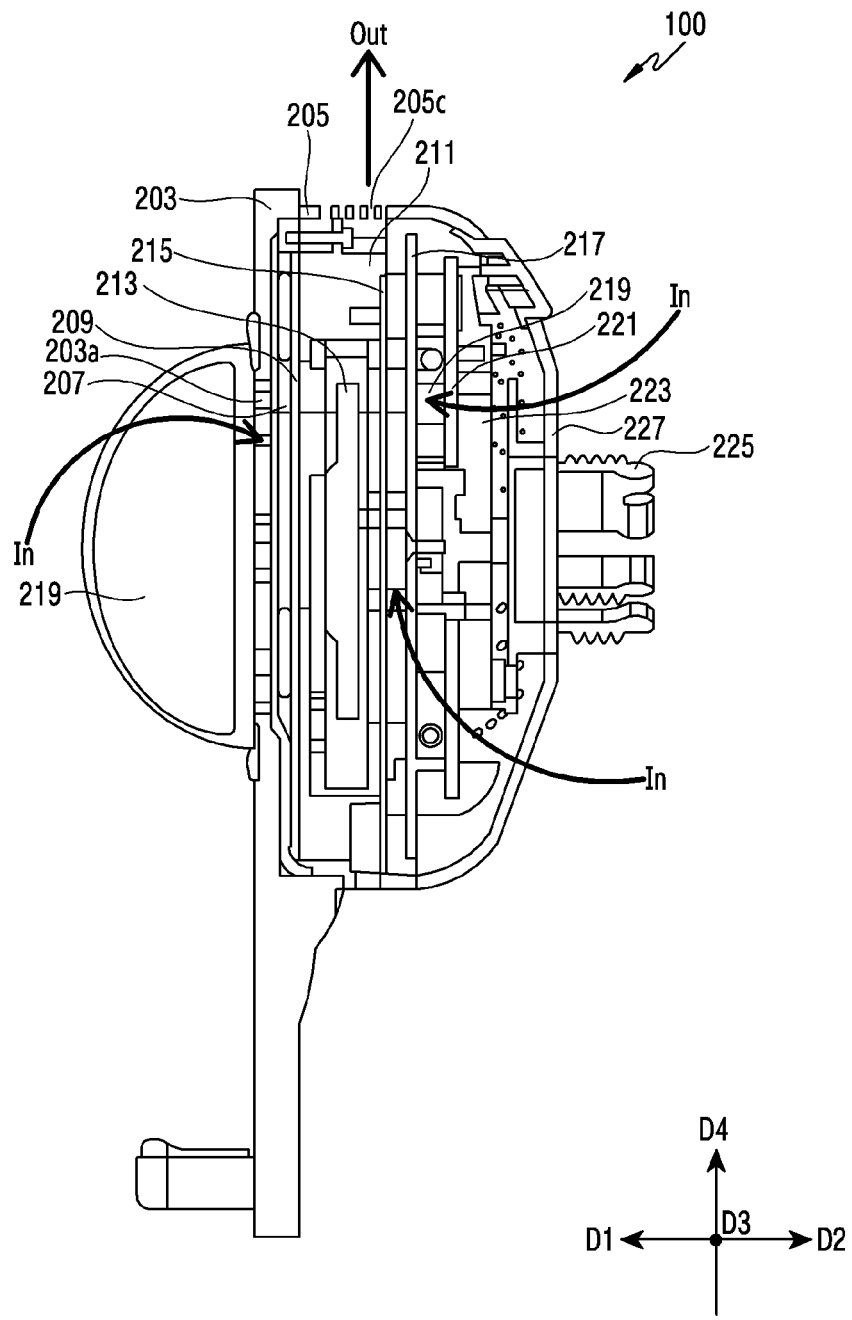
FIG. 3A and FIG. 3B illustrate sectional views of a wireless charging device of various embodiments.
Figure 3B:
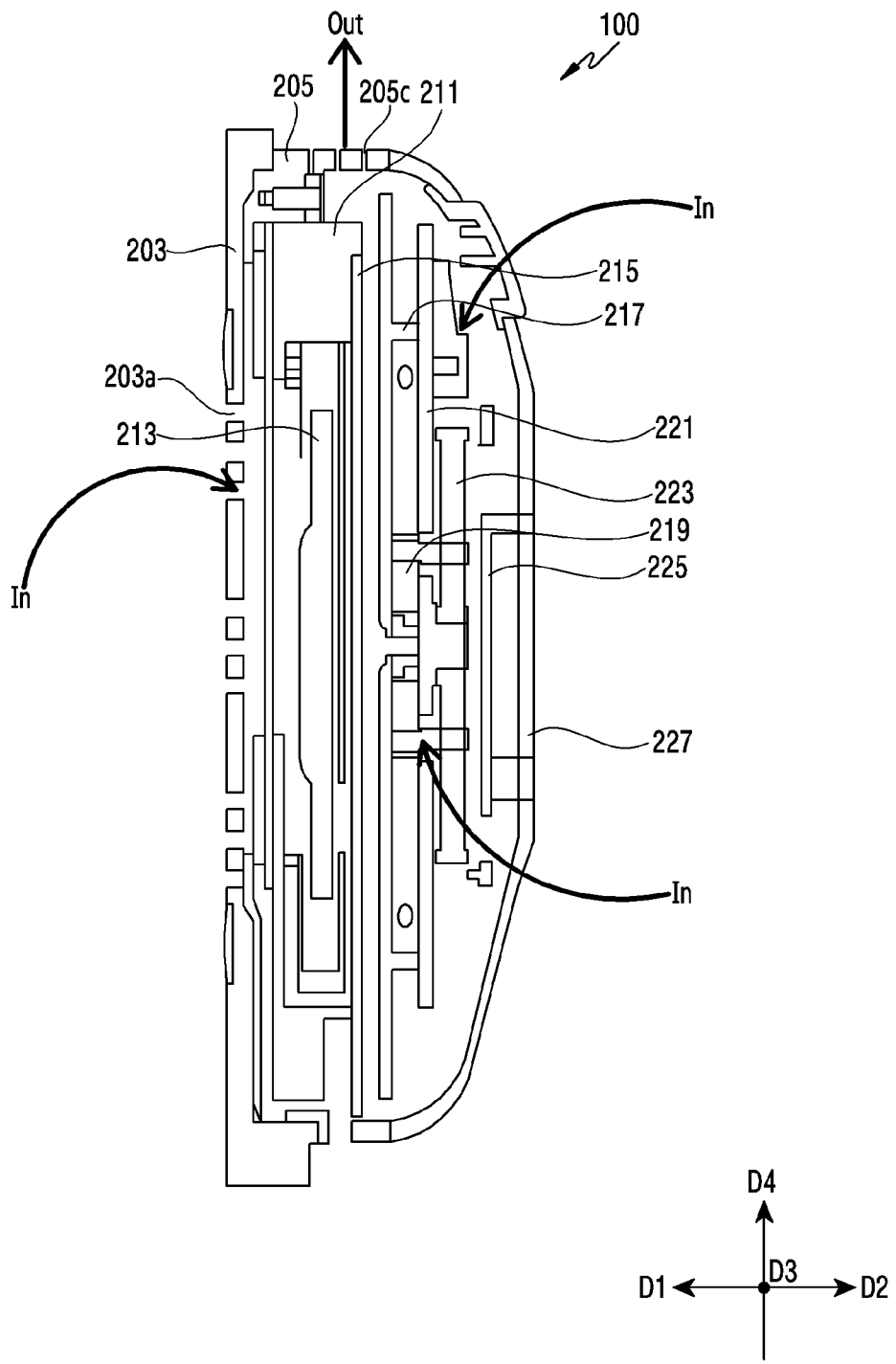

FIG. 3A and FIG. 3B illustrate sectional views of a wireless charging device of various embodiments. FIG. 3A and FIG. 3B illustrate sectional views viewed in the third direction (D3) in FIG. 2A and FIG. 2B.

According to various embodiments, as illustrated in FIG. 3A and FIG. 3B, the wireless charging device 100 may secure the air channels which are formed in various directions. For example, the wireless charging device 100 may secure the air channel formed in the second direction (D2). That is, as explained earlier, air may be introduced in the second direction (D2) of the wireless charging device 100 through the respective holes formed in the first direction (D1) or the second direction (D2) in the first housing 203, the third housing 205, the shielding member 209, the bracket 211 and the like. The air introduced from the front surface of the wireless charging device 100 may be forwarded to the fan 213.

The air introduced into the wireless charging device 100 may be discharged out through the hole 205c provided in the fourth direction (D4) in the third housing 205. Accordingly, the air introduced in the second direction (D2) may be circulated through the fan 213, thereby being discharged in the fourth direction (D4) together with a heat generated in the coil unit 207, the printed board assembly 215 or the like. That is, through the air channel of the second direction (D2), a heat temperature of the coil unit 207 or the printed board assembly 215 may be effectively decreased, and a cooling efficiency may be improved.

According to various embodiments, the air channel may be formed in the third direction (D3) of the wireless charging device 100. That is, as explained earlier, the wireless charging device 100 may introduce air in the third direction (D3) through the hole provided in the third direction (D3) in the third housing 205. Air may be introduced from a side surface of the wireless charging device 100 and be forwarded to the fan 213.

The air introduced into the wireless charging device 100 may be discharged out through the hole 205c provided in the fourth direction (D4) in the third housing 205. Accordingly, air introduced in the third direction (D3) may be circulated through the fan 213, thereby being discharged in the fourth direction (D4) together with a heat generated in the coil unit 207, the printed board assembly 215 or the like. That is, through the air channel of the third direction (D3), a heat temperature of the coil unit 207 or the printed board assembly 215 may be effectively decreased, and a cooling efficiency may be improved.

According to various embodiments, the wireless charging device 100 may secure the air channel that is formed in the first direction (D1). That is, as explained earlier, the wireless charging device 100 may introduce air in the first direction (D1) through the hole that is provided in the first direction (D1) or the second direction (D2) in the second housing 227. The wireless charging device 100 may introduce air in the first direction (D1) through the hole provided in the first direction (D1) or the second direction (D2) in the guide 219. The air introduced from a rear surface of the wireless charging device 100 may be forwarded to the fan 213.

The air introduced into the wireless charging device 100 may be discharged out through the hole 205c that is provided in the fourth direction (D4) in the third housing 205. Accordingly, the air introduced in the first direction (D1) may be circulated through the fan 213, thereby being discharged in the fourth direction (D4) together with a heat generated in the coil unit 207, the printed board assembly 215 or the like. That is, through the air channel of the first direction (D1), a heat temperature of the coil unit 207 or the printed board assembly 215 may be effectively decreased, and a cooling efficiency may be improved.

Figure 4A:
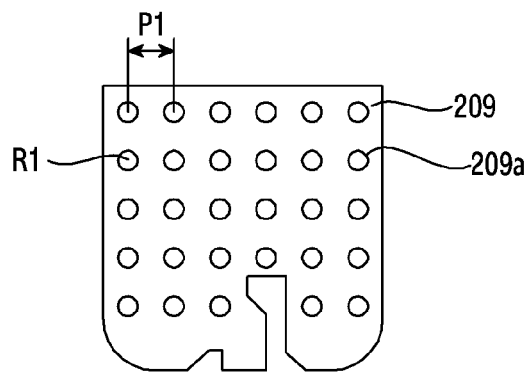
FIG. 4A, FIG. 4B, and FIG. 4C illustrate front views of shielding members included in a wireless charging device of various embodiments.
Figure 4B:
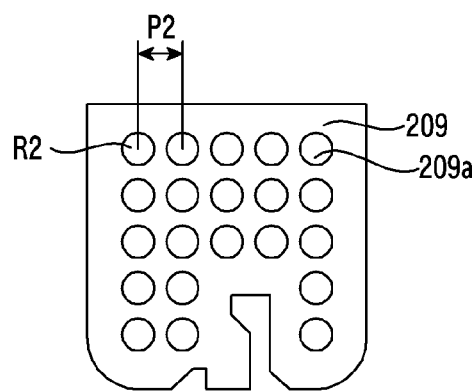
Figure 4C:
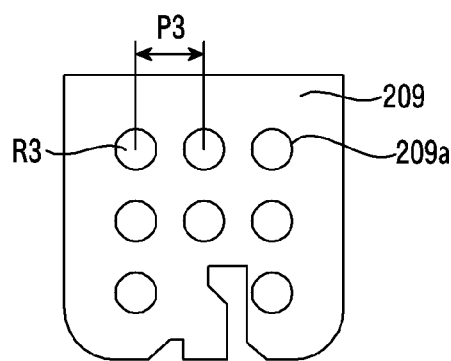

FIG. 4A, FIG. 4B and FIG. 4C illustrate front views of shielding members included in a wireless charging device of various embodiments.

According to various embodiments, as illustrated in FIG. 4A, the shielding member 209 may include a plurality of holes 209a. The hole 209a may include a first diameter (R1). The first diameter (R1) of the hole 209a may, for example, be greater than or be equal to 2 pie ($\pi$) and be less than 4 pie ($\pi$). The plurality of holes 209a may be arranged at a first pitch (P1).

According to various embodiments, as illustrated in FIG. 4B, the shielding member 209 may include a plurality of holes 209a. The hole 209a may include a second diameter (R2). The second diameter (R2) may be greater than the first diameter (R1). The second diameter (R2) of the hole 209a may, for example, be greater than or be equal to 4 pie ($\pi$) and be less than 6 pie ($\pi$). The plurality of holes 209a may be arranged at a second pitch (P2). The second pitch (P2) may be greater than or be equal to the first pitch (P1).

According to various embodiments, as illustrated in FIG. 4C, the shielding member 209 may include a plurality of holes 209a. The hole 209a may include a third diameter (R3). The third diameter (R3) may be greater than the second diameter (R2). The third diameter (R3) of the hole 209a may, for example, be greater than or be equal to 6 pie (π) and be less than 8 pie (π). The plurality of holes 209a may be arranged at a third pitch (P3). The third pitch (P3) may be greater than or be equal to the second pitch (P2).

According to various embodiments, the shielding member 209 included in the wireless charging device 100 may include the plurality of holes 209a, thereby decreasing a temperature of the front surface of the wireless charging device 100 and a temperature of an internal part.

Figure 5A:
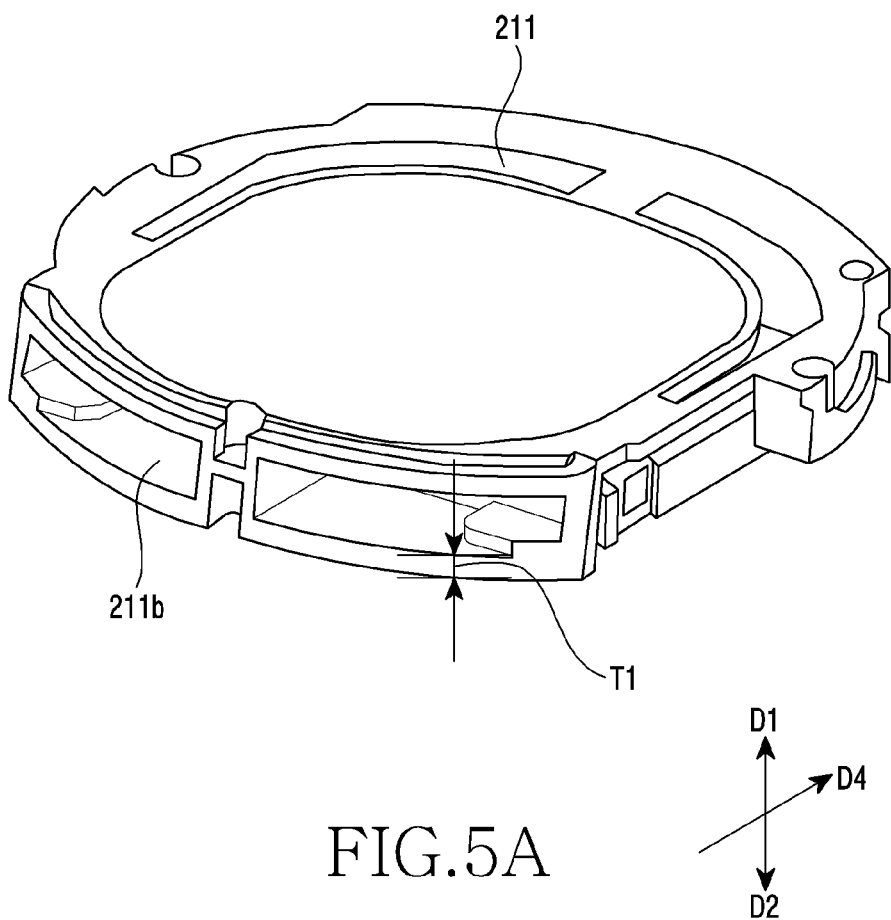
FIG. 5A illustrates a perspective view of a bracket included in a wireless charging device of various embodiments.

FIG. 5A illustrates a perspective view of a bracket included in a wireless charging device of various embodiments.

According to various embodiments, as illustrated in FIG. 5A, the bracket 211 may include the hole 211b provided in the fourth direction (D4). The bracket 211 in which the hole 211b is arranged may have a first thickness (T1). The bracket 211 having the hole 211b may have the first thickness (T1). The first thickness (T1) may be smaller than a thickness of the bracket 211 which is not adjacent to the hole 211b. A thickness of the bracket 211 adjacent to the hole 211b may be formed thinner than the thickness of the bracket 211 not adjacent, thereby securing the size of the hole 211b.

Figure 5B:
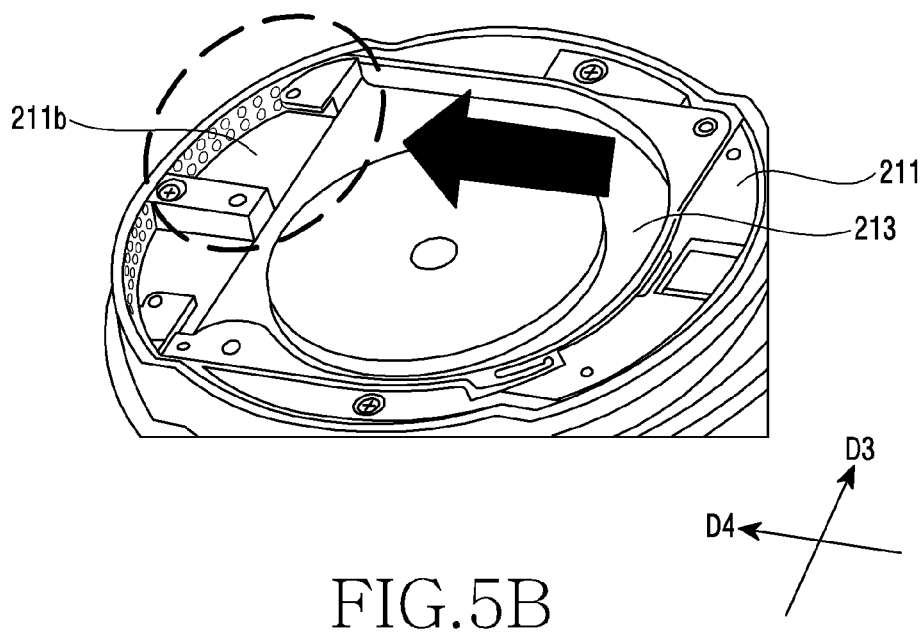
FIG. 5B illustrates a sectional perspective view showing an installation structure of a bracket and a fan included in a wireless charging device of various embodiments.

FIG. 5B illustrates a sectional perspective view showing an installation structure of a bracket and a fan included in a wireless charging device of various embodiments.

According to various embodiments, as illustrated in FIG. 5B, the bracket 211 may support the fan 213. The fan 213 may be installed within the bracket 211. The hole 211b of the bracket 211 may form a passage of discharging introduced air through the rotation of the fan 213. The hole 211b may discharge out the air which is introduced through the air channels formed in various directions. The hole 211b may enable the introduced air to, after being circulated through the fan 213, be discharged together with a heat generated in a wireless charging device internal part. Through the hole 211b, the introduced air may be discharged in the fourth direction (D4).

Figure 6A:
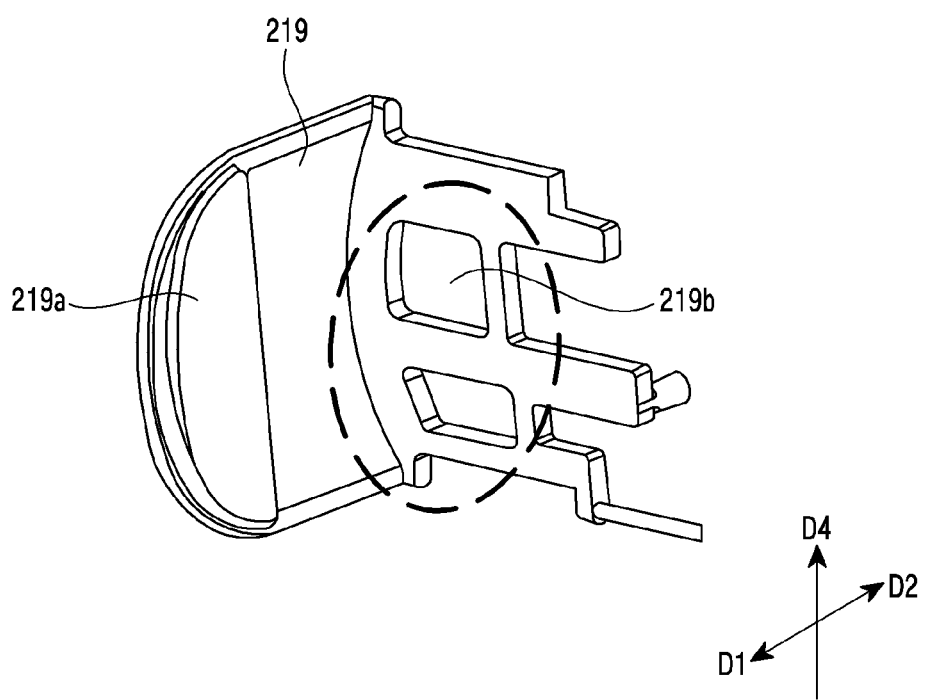
FIG. 6A illustrates a perspective view of a guide included in a wireless charging device of various embodiments.

FIG. 6A illustrates a perspective view of a guide included in a wireless charging device of various embodiments.

According to various embodiments, as illustrated in FIG. 6A, the guide 219 may include the guide arm 219a which is extended in the first direction (D1). The guide arm 219a may fix an external device. The guide arm 219a may get in contact with the external device.

According to various embodiments, the guide 219 may include the hole 219b provided in the first direction (D1) or the second direction (D2). Through the hole 219b, air may be introduced in the first direction (D1) of the wireless charging device. That is, the air may be introduced from a rear surface of the wireless charging device through the hole 219b and be forwarded to the fan 213. The hole 219b may have various sizes, shapes or arrangements.

Figure 6B:
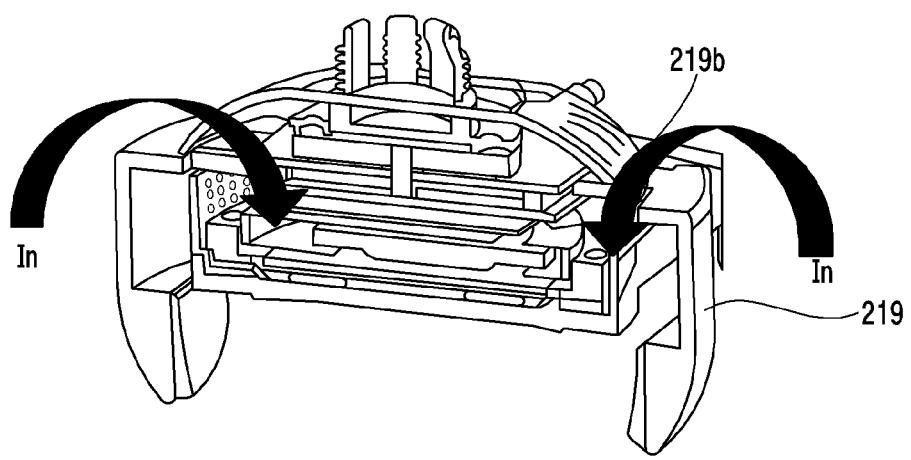
FIG. 6B illustrates a sectional perspective view showing an installation structure of a guide included in a wireless charging device of various embodiments.
Figure 6B:
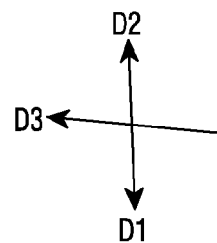

FIG. 6B illustrates a sectional perspective view showing an installation structure of a guide included in a wireless charging device of various embodiments.

According to various embodiments, as illustrated in FIG. 6B, an air channel may be formed in the first direction (D1) of the wireless charging device through the hole 219b of the guide 219 explained earlier. Through the hole 219b of the guide 219, air may be introduced from the rear surface of the wireless charging device. That is, the air may be introduced (In) in an arrow direction shown in the drawing.

Figure 6C:
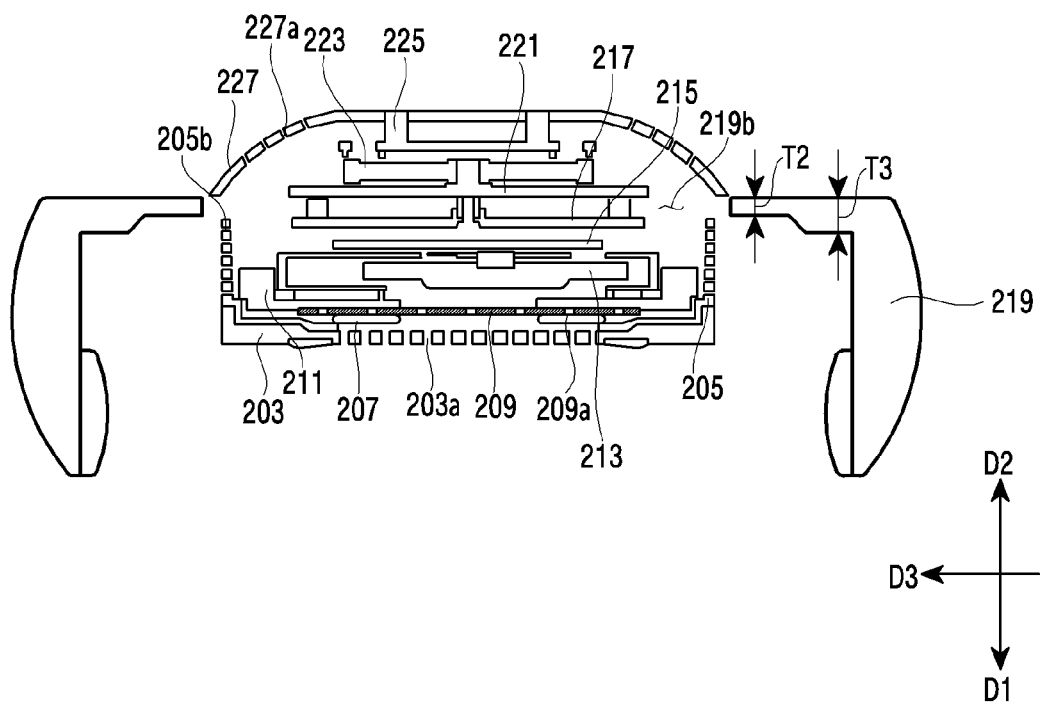
FIG. 6C illustrates a sectional view showing an installation structure of a guide included in a wireless charging device of various embodiments.

FIG. 6C illustrates a sectional view showing an installation structure of a guide included in a wireless charging device of various embodiments.

According to various embodiments, the guide 219 may be configured to be movable in the third direction (D3) of the wireless charging device. The guide 219 may move to get distant from the first housing 203 or get close. The guide 219 may move according to the size of the external device that is safely mounted in the first housing 203.

According to various embodiments, the guide 219 may include portions having mutually different thicknesses. For example, the guide 219 may include a portion having a second thickness (T2) in a portion extended in the third direction (D3), and a portion having a third thickness (T3) thicker than the second thickness (T2). In the portion extended in the third direction (D3) of the guide 219, the portion close to the third housing 205 may have the second thickness (T2), and the portion distant from the third housing 205 may have the third thickness (T3). In response to the guide 219 being arranged to get close to the third housing 205 to fix the external device, a space may be provided between the portion having the second thickness (t2) thinner than the third thickness (T3) and the third housing 205. Through this, air introduction through the space between the guide 219 and the third housing 205 may be made smooth.

According to various embodiments, a wireless charging device may include a first housing, which includes a first surface facing a first direction and a second surface facing a second direction opposite to the first direction, and includes at least one hole; a second housing arranged along the second direction on the second surface of the first housing; a coil unit arranged between the first housing and the second housing, and configured to transmit power to an external device; a shielding member arranged adjacent to the coil unit, and including at least one hole; and a fan arranged adjacent to the coil unit and configured to rotate.

According to various embodiments, the fan may receive external air through the hole of the first housing and the hole of the shielding member.

According to various embodiments, a pad may be further arranged on the first surface of the first housing, and the pad may include at least one protrusion protruded in the first direction.

According to various embodiments, the first housing may be configured to safely mount the external device on the first surface.

According to various embodiments, the at least one protrusion may provide a space between the first surface of the first housing and the external device.

According to various embodiments, it may further include a third housing arranged between the first housing and the second housing, and the third housing may include a first surface facing the first direction, a second surface facing the second direction, and a hole passing through the first surface and the second surface.

According to various embodiments, the third housing may include a third surface facing a third direction which intersects with the first direction and the second direction, and include at least one hole provided in the third surface.

According to various embodiments, the fan may receive external air through the at least one hole provided in the third surface.

According to various embodiments, the third housing may include a fourth surface facing a fourth direction which intersects with the first direction, the second direction and the third direction, and include at least one hole provided in the fourth surface.

According to various embodiments, the at least one hole provided in the fourth surface may form an air channel for discharging out air introduced into the wireless charging device.

According to various embodiments, it may further include a guide arranged between the first housing and the second housing, and configured to support the external device.

According to various embodiments, the guide may be configured to move in the third direction which intersects with the first direction and the second direction.

According to various embodiments, the guide may further include a guide arm extended in the first direction.

According to various embodiments, the guide may include at least one hole, and air may be introduced through the hole of the guide and be forwarded to the fan.

According to various embodiments, the guide may include at least any one of portions of different thicknesses.

According to various embodiments, a portion close to the first housing in the guide may be smaller in thickness than a portion distant from the first housing.

According to various embodiments, it may further include a bracket which supports the coil unit and the shielding member, and the bracket may include a hole provided in the second direction.

According to various embodiments, the fan may receive external air through the hole provided in the second direction in the bracket.

According to various embodiments, the bracket may include a hole provided in the fourth direction.

According to various embodiments, the hole provided in the fourth direction may form an air channel for discharging out air introduced into the wireless charging device.

Various embodiments of the present disclosure disclosed in the present specification and drawings are to just suggest specific examples so as to easily explain technology content of the present disclosure and help the understanding of the present disclosure, and do not intend to limit the scope of the present disclosure. Accordingly, the scope of the present disclosure should be construed as including all modified or changed forms drawn on the basis of the technological spirit of the present disclosure besides the embodiments disclosed herein.

What is claimed is:

1. A wireless charging device comprising:
    a housing forming a front surface of the device and a housing forming a rear surface of the device;
    a coil unit arranged between the front surface and the rear surface;
    a shielding member arranged between the coil unit and the rear surface, and comprising at least one hole; and
    a fan arranged between the shielding member and the rear surface.

2. The wireless charging device of claim 1, wherein the at least one hole is formed in the front surface and at least one hole is formed in the rear surface.

3. The wireless charging device of claim 1, wherein the at least one hole of the shielding member provides an air path between the coil unit and the fan.

4. The wireless charging device of claim 2, wherein the fan receives external air through the hole of the front surface and the hole of the shielding member.

5. The wireless charging device of claim 1, wherein a pad is further arranged on a front side of the front surface, and
    the pad comprises at least one protrusion protruded in a front direction.

6. The wireless charging device of claim 5,
    wherein the at least one protrusion provides a space between the front surface and an external device.

7. The wireless charging device of claim 1, further comprising a third housing arranged between the front surface and the rear surface,
    wherein the third housing comprises a first surface facing a front direction, a second surface facing a rear direction, and a hole passing through the first surface and the second surface.

8. The wireless charging device of claim 7, wherein the third housing comprises a third surface facing a third direction which intersects with the front direction and the rear direction, and
    comprises at least one hole provided in the third surface, and
    wherein the fan receives external air through the at least one hole provided in the third surface.

9. The wireless charging device of claim 7, wherein the third housing comprises a fourth surface facing a fourth direction which intersects with the front direction, the rear direction and a third direction, and
    comprises at least one hole provided in the fourth surface.

10. The wireless charging device of claim 9, wherein the at least one hole provided in the fourth surface forms an air channel for discharging out air introduced into the wireless charging device.

11. The wireless charging device of claim 1, further comprising a guide arranged between the front surface and the rear surface, and configured to support an external device.

12. The wireless charging device of claim 11, wherein the guide comprises at least one hole, and
    air is introduced through the hole of the guide and is forwarded to the fan.

13. The wireless charging device of claim 1, further comprising a bracket which supports the coil unit and the shielding member,
    wherein the bracket comprises a hole provided in a rear direction.

14. The wireless charging device of claim 13, wherein the fan receives external air through the hole provided in the rear direction in the bracket.

15. The wireless charging device of claim 13, wherein the bracket comprises a hole provided in a fourth direction, and
    the hole provided in the fourth direction forms an air channel for discharging out air introduced into the wireless charging device.

* * * * *